(12) United States Patent
Kim et al.

(10) Patent No.: US 10,847,592 B2
(45) Date of Patent: Nov. 24, 2020

(54) ELECTROLUMINESCENT DISPLAY DEVICE

(71) Applicant: LG Display Co., Ltd., Seoul (KR)

(72) Inventors: Kang-Hyun Kim, Paju-si (KR); Geum-Young Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 39 days.

(21) Appl. No.: 16/212,067

(22) Filed: Dec. 6, 2018

(65) Prior Publication Data

US 2019/0181204 A1 Jun. 13, 2019

(30) Foreign Application Priority Data

Dec. 11, 2017 (KR) ........................ 10-2017-0169097

(51) Int. Cl.
| | |
|---|---|
| *H01L 27/32* | (2006.01) |
| *H01L 51/52* | (2006.01) |
| *H01L 51/00* | (2006.01) |
| *H01L 27/12* | (2006.01) |
| *H01L 51/50* | (2006.01) |

(52) U.S. Cl.
CPC ...... *H01L 27/3258* (2013.01); *H01L 27/3246* (2013.01); *H01L 51/0003* (2013.01); *H01L 51/5206* (2013.01); *H01L 27/1248* (2013.01); *H01L 51/5012* (2013.01); *H01L 51/5218* (2013.01); *H01L 2251/308* (2013.01); *H01L 2251/5315* (2013.01)

(58) Field of Classification Search
CPC ............. H01L 27/3246; H01L 27/3295; H01L 27/1248; H01L 27/3248; H01L 27/3258; H01L 27/3262; H01L 27/3265; H01L 51/0003; H01L 51/5012; H01L 51/5206; H01L 51/5218; H01L 2251/308; H01L 2251/5315
See application file for complete search history.

(56) References Cited

U.S. PATENT DOCUMENTS

| | | | | |
|---|---|---|---|---|
| 6,373,453 | B1 * | 4/2002 | Yudasaka | G09G 3/3225 315/169.3 |
| 6,380,672 | B1 * | 4/2002 | Yudasaka | H01L 27/3246 313/504 |
| 7,354,328 | B2 * | 4/2008 | Lee | H01L 27/3246 313/306 |
| 9,893,285 | B2 * | 2/2018 | Kim | H01L 51/5225 |
| 10,038,043 | B2 * | 7/2018 | Hsu | H01L 27/3262 |
| 2003/0122495 | A1 * | 7/2003 | Nakanishi | G02F 1/13454 315/169.3 |
| 2003/0139790 | A1 * | 7/2003 | Ingle | A61B 18/1482 607/99 |

(Continued)

*Primary Examiner* — Mary A Wilczewski
(74) *Attorney, Agent, or Firm* — Fenwick & West LLP

(57) ABSTRACT

An electroluminescent display device includes a substrate; a pixel having a first lateral side and a second lateral side that intersects the first lateral side, the pixel including an emitting diode disposed over the substrate, the emitting diode including a first electrode, an emitting layer on the first electrode, and a second electrode on the emitting layer; an insulating pattern overlapping the first lateral side of the pixel and covering a first end of the first electrode at the first lateral side of the pixel; and a bank surrounding the pixel, wherein the bank overlaps the insulating pattern at the first lateral side of the pixel, and the bank at the second lateral side of the pixel covers a second end of the first electrode.

19 Claims, 5 Drawing Sheets

(56) References Cited

U.S. PATENT DOCUMENTS

| | | | |
|---|---|---|---|
| 2003/0146710 A1* | 8/2003 | Nakanishi | H01L 27/3223 315/169.3 |
| 2003/0169242 A1* | 9/2003 | Nakanishi | H01L 27/3223 345/204 |
| 2003/0190763 A1* | 10/2003 | Cok | H01L 27/3211 438/22 |
| 2004/0124770 A1* | 7/2004 | Hayashi | H01L 51/5203 313/506 |
| 2004/0201048 A1* | 10/2004 | Seki | H01L 51/0005 257/294 |
| 2004/0207312 A1* | 10/2004 | Takashima | C09K 11/06 313/503 |
| 2005/0022374 A1* | 2/2005 | Hirai | H01L 21/4867 29/825 |
| 2005/0112341 A1* | 5/2005 | Ito | H01L 27/3246 428/209 |
| 2005/0116632 A1* | 6/2005 | Funamoto | H01L 27/3246 313/506 |
| 2005/0186698 A1* | 8/2005 | Ishida | H01L 27/3246 438/99 |
| 2005/0266763 A1* | 12/2005 | Kimura | H01L 51/0005 445/24 |
| 2006/0066219 A1* | 3/2006 | Shimoda | H01L 27/3244 313/500 |
| 2006/0255720 A1* | 11/2006 | Hirai | H01L 51/0005 313/503 |
| 2007/0264899 A1* | 11/2007 | Kumagai | H01L 27/3246 445/24 |
| 2008/0224600 A1* | 9/2008 | Im | H01L 27/3276 313/504 |
| 2008/0230772 A1* | 9/2008 | Kamiura | H01L 27/3246 257/40 |
| 2008/0290790 A1* | 11/2008 | Jin | H01L 27/3246 313/504 |
| 2010/0066240 A1* | 3/2010 | Park | H01L 27/3246 313/504 |
| 2010/0133993 A1* | 6/2010 | Pang | H01L 27/3246 313/504 |
| 2010/0200869 A1* | 8/2010 | Sekiya | H01L 27/3246 257/88 |
| 2010/0244070 A1* | 9/2010 | Lee | H01L 27/3246 257/98 |
| 2011/0198598 A1* | 8/2011 | Kim | H01L 27/3246 257/59 |
| 2011/0260204 A1* | 10/2011 | Akagawa | H01L 27/3246 257/99 |
| 2012/0146033 A1* | 6/2012 | Lee | H01L 27/1248 257/59 |
| 2015/0333110 A1* | 11/2015 | Park | H01L 21/308 257/40 |
| 2016/0172422 A1* | 6/2016 | Kim | H01L 27/3246 257/40 |
| 2016/0233280 A1* | 8/2016 | Cheng | H01L 27/1218 |
| 2017/0117476 A1* | 4/2017 | Kim | H01L 51/5225 |
| 2017/0133446 A1* | 5/2017 | Hsu | H01L 27/32 |
| 2019/0181204 A1* | 6/2019 | Kim | H01L 27/3246 |
| 2020/0194513 A1* | 6/2020 | Kim | H01L 51/5092 |

* cited by examiner

ELECTROLUMINESCENT DISPLAY DEVICE

CROSS-REFERENCE TO RELATED APPLICATIONS

The present application claims the benefit of Republic of Korea Patent Application No. 10-2017-0169097 filed in the Republic of Korea on Dec. 11, 2017, which is hereby incorporated by reference in its entirety.

BACKGROUND

Field of Technology

The present disclosure relates to a display device, and more particularly, to an electroluminescent display device being capable of improving a uniformity of an emitting layer and preventing damages on the emitting layer.

Discussion of the Related Art

An electroluminescent (EL) display device among new flat panel display devices is a self-emission type display device such that there are advantages in a viewing angle, a contrast ratio in comparison to a liquid crystal display device. In addition, since a backlight unit is not required in the EL display device, there are advantages of a thin profile and low power consumption.

Moreover, the EL display device can be driven by DC low voltage and has fast response time. Furthermore, the EL display device is stable against outer impacts and has advantages in an operation temperature and production cost.

In an active matrix type EL display device, a voltage, which control a current applied to a pixel, is charged in a storage capacitor such that a voltage is maintained during one frame. As a result, the EL display device has an emission state in a frame regardless of a number of gate lines.

FIG. 1 is a schematic cross-sectional view of the related art EL display device.

As shown in FIG. 1, the related art EL display device includes a substrate 10, a driving thin film transistor (TFT) Td on the substrate 10 and an emitting diode D connected to the driving TFT Td.

A semiconductor layer 20 is formed on the substrate 10 of glass or plastic. The semiconductor layer 20 may include an oxide semiconductor material or a polycrystalline silicon.

A gate insulating layer 26 is formed on an entire surface of the substrate 10. The gate insulating layer 26 may be formed of an inorganic insulating material such as silicon oxide or silicon nitride.

A gate electrode 30, which is formed of a conductive material, e.g., metal, is formed on the gate insulating layer 26 to correspond to a center of the semiconductor layer 20.

An interlayer insulating layer 36, which is formed of an insulating material, is formed on the gate electrode 30 and over the entire surface of the substrate 10. The interlayer insulating layer 36 may be formed of an inorganic insulating material, e.g., silicon oxide or silicon nitride, or an organic insulating material, e.g., benzocyclobutene or photo-acryl.

The interlayer insulating layer 36 includes a first contact hole 37 and a second contact hole 38 exposing both sides of the semiconductor layer 20. The first and second contact holes 37 and 38 are positioned at both sides of the gate electrode 30 to be spaced apart from the gate electrode 30.

A source electrode 40 and a drain electrode 42, which are formed of a conductive material, e.g., metal, are formed on the interlayer insulating layer 36.

The semiconductor layer 20, the gate electrode 30, the source electrode 40 and the drain electrode 42 constitute the driving TFT Td.

Although not shown, a gate line, a data line, a switching TFT, a power line are disposed on or over the substrate 10. The gate line and the data line cross each other to define a pixel region, and the switching TFT is electrically connected to the gate line and the data line. The driving TFT Td is connected to the switching TFT. A storage capacitor is further formed in the pixel region.

A passivation layer 50, which includes a drain contact hole 52 exposing the drain electrode 42 of the driving TFT Td, is formed to cover the driving TFT Td.

A first electrode 60, which is connected to the drain electrode 42 of the driving TFT Td through the drain contact hole 52, is formed.

A bank 70 is formed on the passivation layer 50 to cover an edge of the first electrode 60. The bank 70 has an opening exposing a center of the first electrode 60.

An emitting layer 62 and a second electrode 64 are sequentially stacked on the first electrode 60.

The first electrode 60, the second electrode 64 facing the first electrode 60 and the emitting layer 62 therebetween constitute the emitting diode D.

On the other hand, the emitting layer is formed by a thermal deposition process. However, there is a limitation in the application of the thermal deposition process for the large size EL display device.

Recently, a solution process for the emitting layer is introduced. However, when the emitting layer is formed by the solution process, the aperture ratio of the EL display device may be decreased or the emitting layer is partially formed in the aperture ratio (non-coating problem of the emitting layer).

Namely, in the EL display device, where the emitting layer is formed by the solution process, the brightness (or luminescence) and the display quality of the EL display device may be decreased.

SUMMARY

Accordingly, the present invention is directed to an electroluminescent display device that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an electroluminescent display device includes a substrate; a pixel having a first lateral side and a second lateral side that intersects the first lateral side, the pixel including an emitting diode disposed over the substrate, the emitting diode including a first electrode, an emitting layer on the first electrode, and a second electrode on the emitting layer; an insulating pattern overlapping the first lateral side of the pixel and covering a first end of the first electrode at the first lateral side of the pixel; and a bank surrounding the pixel, wherein the bank overlaps the insulating pattern at the first lateral side of the pixel, and the bank at the second lateral side of the pixel covers a second end of the first electrode.

In one embodiment, an electroluminescent display device, comprises: a pixel including a plurality of first edges in a first direction and a plurality of second edges in a second direction that is different from the first direction, the pixel having a first electrode, a light emitting layer on the first electrode, and a second electrode on the light emitting layer; a first insulating layer overlapping one edge of the plurality of first edges of the pixel, the first insulating pattern covering a first end of the first electrode at the first edge of the plurality of first edges of the pixel; a second insulating layer overlapping another edge of the plurality of first edges of the pixel, the second insulating pattern covering a second end of the first electrode that is opposite the first end of the first electrode at the second edge of the plurality of first edges of the pixel; and a bank surrounding the pixel, the bank configured to overlap the first insulation layer without overlapping the first end of the first electrode at the one edge of the plurality of first edges of the pixel, and overlap the second insulation layer without overlapping the second end of the first electrode at the other edge of the plurality of first edges of the pixel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

As mentioned above, when the emitting layer is formed by the solution process, the aperture ratio of the EL display device may be decreased or the non-coating problem of the emitting layer may be generated. The problems are explained in more detail.

Figure 1:
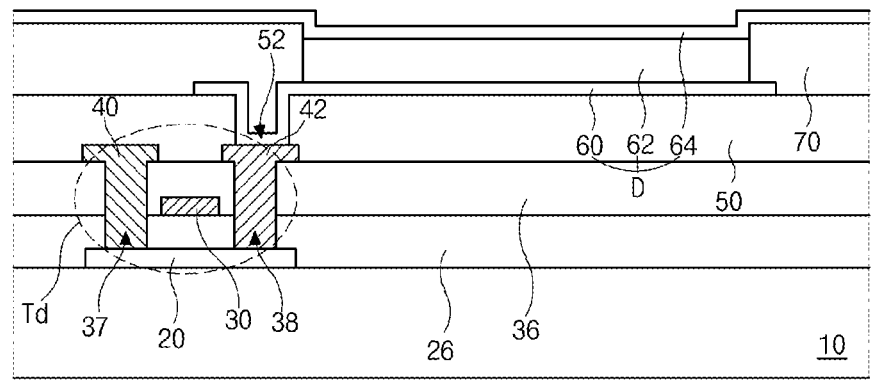
FIG. 1 is a schematic cross-sectional view of the related art EL display device.
Figure 2:
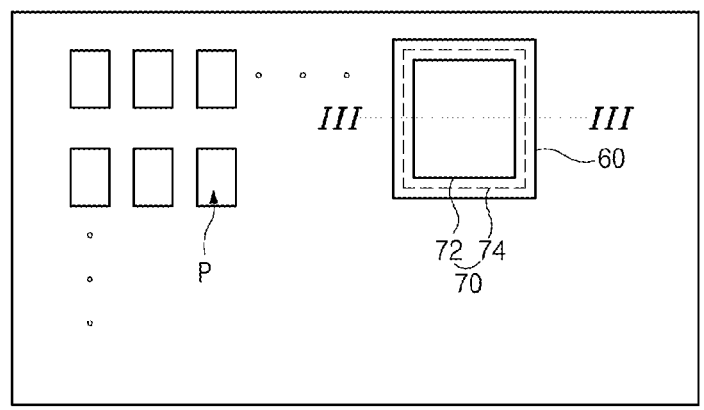
FIG. 2 is a schematic plan view illustrating the decrease of the aperture ration in an EL display device.
Figure 3:
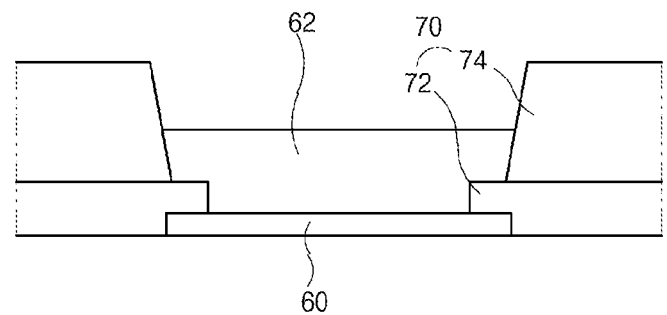
FIG. 3 is a cross-sectional view taken along the line of FIG. 2.

FIG. 2 is a schematic plan view illustrating the decrease of the aperture ration in an EL display device, and FIG. 3 is a cross-sectional view taken along the line III-III of FIG. 2.

As shown in FIGS. 2 and 3, the EL display device includes a plurality of pixels P, and an emitting diode including a first electrode 60, an emitting layer 62 and a second electrode (not shown) is formed in each pixel P.

In addition, a bank 70 surrounding each pixel P is formed. The bank 70 covers an edge of the first electrode 60 and exposes a center of the first electrode 60.

The emitting layer 62 is formed by the solution process. In a drying process of an emitting material ink formed by the solution process, a thickness of the emitting layer 62 is thicker in the edge of the pixel P than that in the center of the pixel P. This may be referred to as the pile-up problem or a coffee-ring problem.

To prevent the pile-up problem, the bank 70 includes a first bank 72 having a hydrophilic property and a second bank 74 having a hydrophobic property (dual bank structure). In the dual bank structure, the emitting material ink (emitting material solution) is efficiently dispersed at an edge of the pixel P due to the first bank 72 of the hydrophilic property such that the pile-up problem may be prevented.

However, since the first bank 72 covers an edge of the first electrode 60, the aperture ratio of the EL display device is decreased by an overlapping area of the first bank 72 and the first electrode 60.

On the other hand, to prevent the aperture ratio decrease by the dual bank structure, the EL display device including a single bank structure is introduced. However, in the single bank structure EL display device, the emitting layer is not formed (coated) at a corner of the pixel. Accordingly, the EL display device, where the pixel has a round-corner shape, is introduced.

Figure 4:
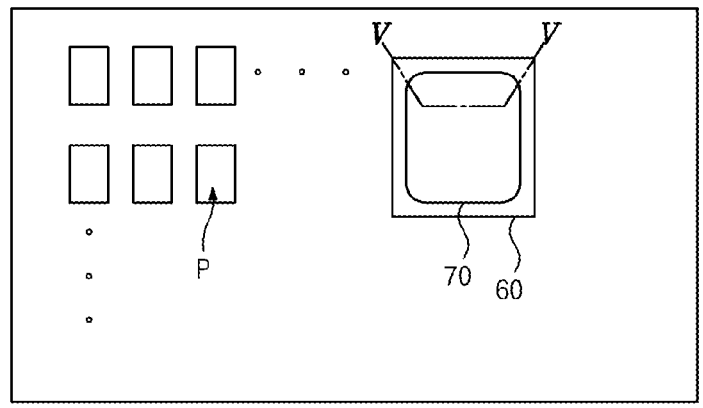
FIG. 4 is a schematic plan view illustrating a non-coating problem of the emitting layer in EL display device.
Figure 5:
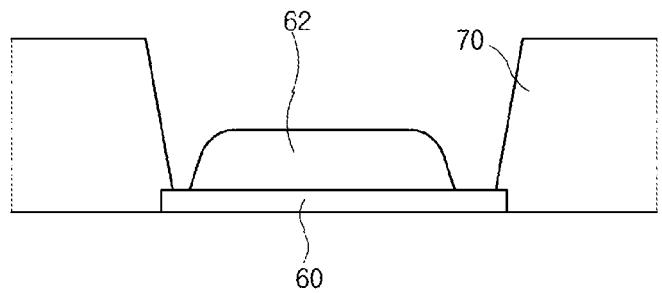
FIG. 5 is a cross-sectional view taken along the line V-V of FIG. 4.

FIG. 4 is a schematic plan view illustrating a non-coating problem of the emitting layer in EL display device, and FIG. 5 is a cross-sectional view taken along the line V-V of FIG. 4.

As shown in FIGS. 4 and 5, the EL display device includes a plurality of pixels P, and an emitting diode including a first electrode 60, an emitting layer 62 and a second electrode (not shown) is formed in each pixel P.

In addition, a bank 70 surrounding each pixel P is formed. The bank 70 covers an edge of the first electrode 60 and exposes a center of the first electrode 60.

The emitting layer 62 is formed by the solution process. However, since the bank 70 has a round shape at a corner of the pixel P, the emitting material solution may be coated in the corner of the pixel P.

In this instance, the bank 70 has a single-layered structure such that the aperture ratio decrease, which is generated in the dual bank structure, is prevented.

However, although the bank 70 has a round shape at a corner of the pixel P, there is still a limitation to completely form the emitting layer 62 in the corner of the pixel P. Namely, a change of the plan shape of the bank 70 is insufficient to overcome the non-coating problem of the emitting layer 62.

In addition, the aperture ratio is still decreased by the round shape of the bank 70.

Moreover, in the non-coating region of the emitting layer 62, a short of the first electrode 60 and the second electrode (not shown) may be generated due to the first electrode 60 and the second electrode coming into contact in the non-coating region.

Reference will now be made in detail to the embodiments, examples of which are illustrated in the accompanying drawings.

Figure 6:
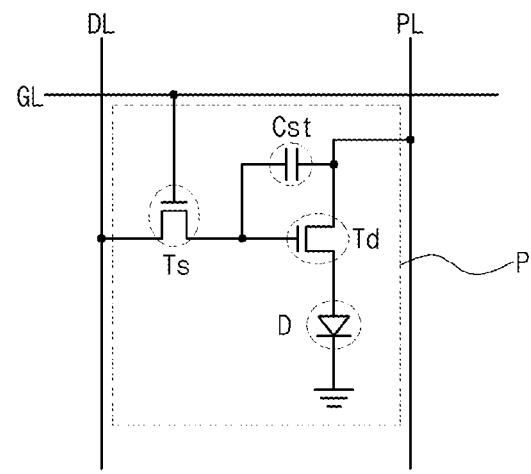
FIG. 6 is a schematic circuit diagram of an EL display device according to the present embodiment.

FIG. 6 is a schematic circuit diagram of an EL display device according to the present invention.

Referring to FIG. 6, an EL display device includes a gate line GL, a data line DL, a power line PL, a switching thin film transistor (TFT) Ts, a driving TFT Td, a storage capacitor Cst, and an emitting diode D. The gate line GL and the data line DL cross each other to define a pixel region P. Although not shown, the EL display device may further include a compensation circuit part compensating a threshold voltage of the driving TFT Td.

The switching TFT Ts, the driving TFT Td, the storage capacitor Cst and the compensation circuit part may be referred to as a driving part.

The switching TFT Ts is connected to the gate and data line GL and DL, and the driving TFT Td and the storage capacitor Cst are connected to the switching TFT Ts and the power line PL. The emitting diode D is connected to the driving TFT Td.

In the EL display device, when the switching TFT Ts is turned on by a gate signal applied through the gate line GL, a data signal from the data line DL is applied to the gate electrode of the driving TFT Td and an electrode of the storage capacitor Cst. When the driving TFT Td is turned on by the data signal, an electric current is supplied to the emitting diode D from the power line PL. As a result, the emitting diode D emits light. In this case, when the driving TFT Td is turned on, a level of an electric current applied from the power line PL to the emitting diode D is determined such that the emitting diode D can produce a gray scale.

The storage capacitor Cst serves to maintain the voltage of the gate electrode of the driving TFT Td when the switching TFT Ts is turned off. Accordingly, even if the switching TFT Ts is turned off, a level of an electric current applied from the power line PL to the emitting diode D is maintained to next frame. Accordingly, the EL display device displays an image.

Figure 7:
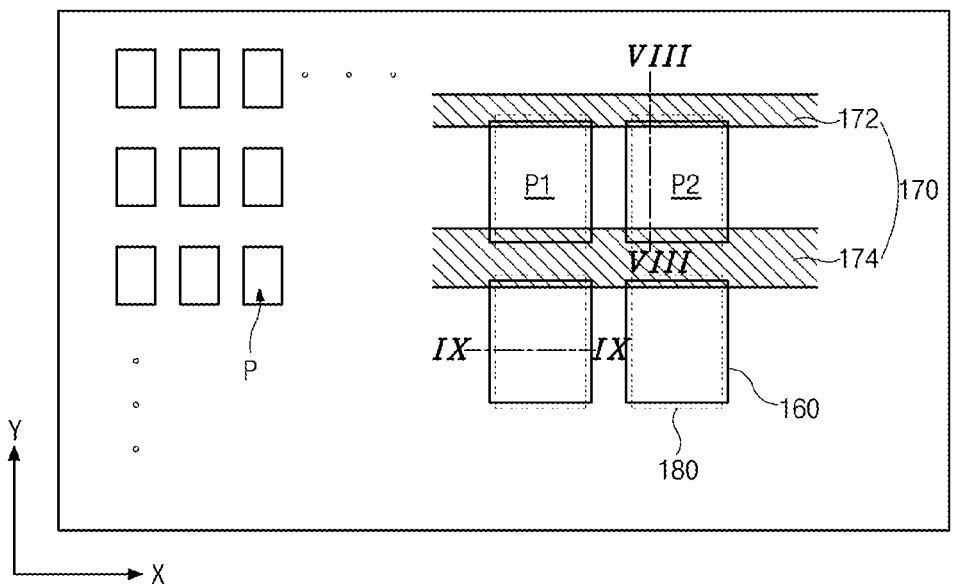
FIG. 7 is a schematic plan view of an EL display device according to a first embodiment of the present embodiment.

FIG. 7 is a schematic plan view of an EL display device according to a first embodiment of the present disclosure.

As shown in FIG. 7, the EL display device 100 includes a plurality of pixels P, where an emitting diode (not shown) is formed, an insulating pattern 170 and a bank 180. The plurality of pixels P are arranged along a first direction X and a second direction Y. The insulating pattern 170 extends along the first direction X and is positioned at a boundary of the pixels adjacent to each other in the second direction Y. The bank 180 surrounds four sides of each pixel P.

For example, when a first pixel P1 and a second pixel P2 adjacent to each other in the first direction X are defined, the insulating pattern 170 includes a first insulating pattern 172 corresponding to a first side (e.g., a first lateral side) of the first and second pixels P1 and P2 and a second insulating pattern 174 corresponding to a second side (e.g., a second lateral side) of the first and second pixels P1 and P2. The insulating pattern 170 may correspond to the driving part including the driving TFT Td (of FIG. 5), the switching TFT Ts (of FIG. 5), the compensation circuit part, and so on.

When the pixel P has a longer side (a major side) and a shorter side (a minor side), the insulating pattern 170 may correspond to the shorter side of the pixel P.

The insulating pattern 170 corresponds to a corner of the pixel P and covers an end of a first electrode 160 of the emitting diode. Accordingly, in the EL display device 100 of the present disclosure, the first electrode 160 and an emitting layer 162 of the emitting diode D do not contact in the corner of the pixel P due to the insulating pattern 170 such that the corner of the pixel P does not serve as an emitting region.

As mentioned above, when the emitting layer is formed by the solution process, the emitting material solution is not coated in the corner of the pixel P. However, in the EL display device 100, since the corner of the pixel P is not the emitting region, there is no problem in the emitting property of the pixel P even though the non-coating area is generated.

In addition, although the non-coating region of the emitting layer is generated in the corner of the pixel P, the shortage between the first electrode 160 and a second electrode (not shown) in the corner of the pixel P is prevented by the insulating pattern 170.

Moreover, since the insulating pattern 170 does not have a round shape in the corner of the pixel P, the decreased problem of the effective aperture ratio by the round shape of the bank is prevented.

In FIG. 7, each of the first insulating pattern 172 and the second insulating pattern 174 is one-body in a pixel row along the first direction X.

Figure 8:
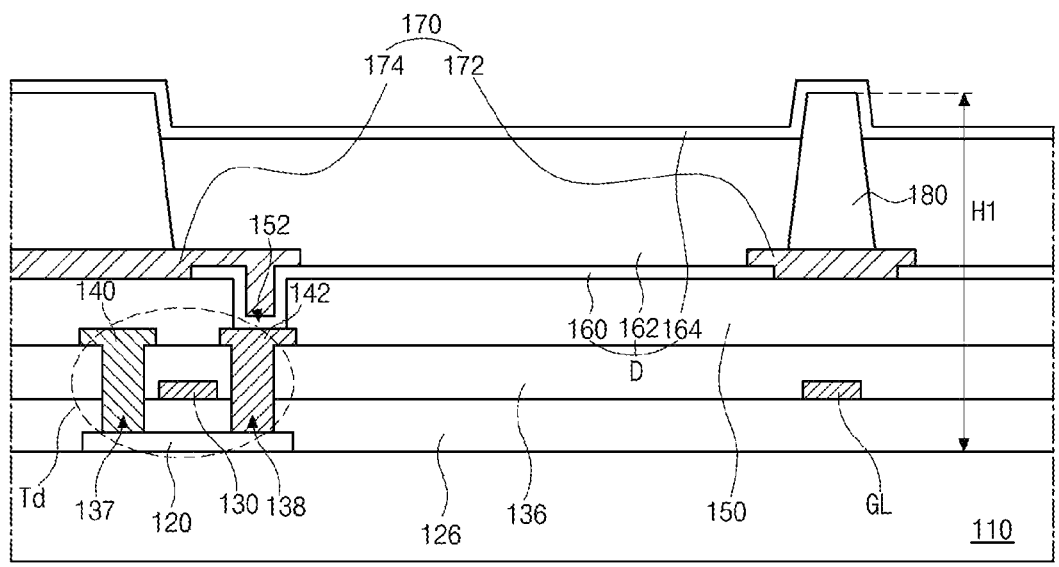
FIG. 8 is a cross-sectional view taken along the line VIII-VIII of FIG. 7 according to the first embodiment.
Figure 9:
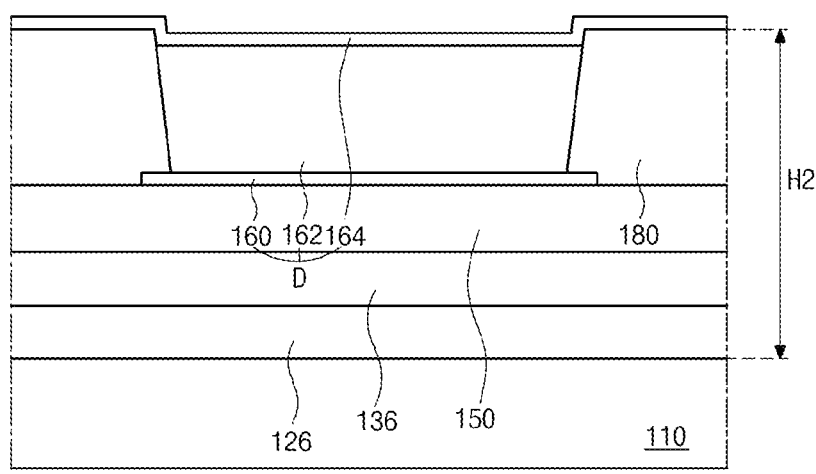
FIG. 9 is a cross-sectional view taken along the line IX-IX of FIG. 7 according to the first embodiment.
Figure 10:
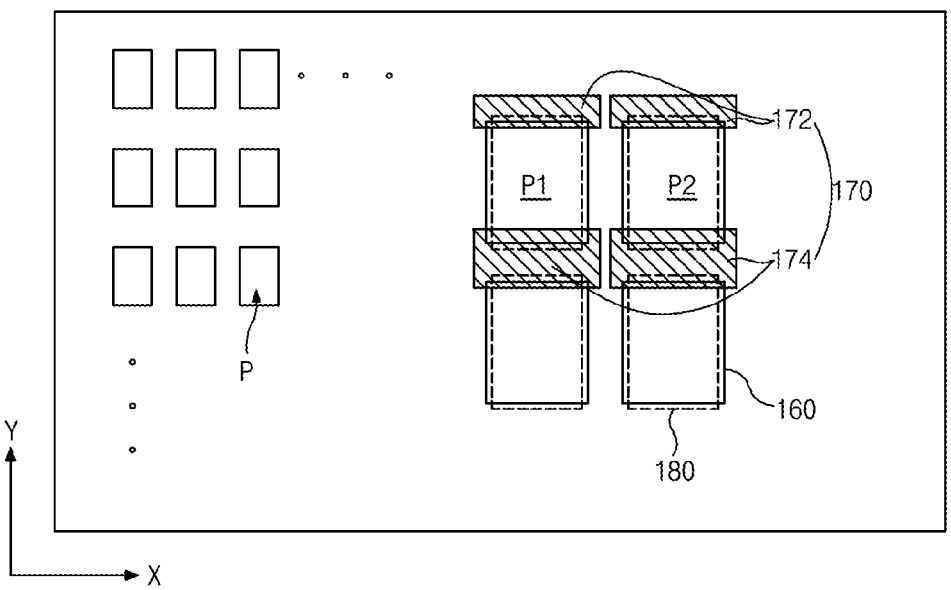
FIG. 10 is a schematic plan view of an EL display device according to a second embodiment of the present disclosure.

Alternatively, each of the first insulating pattern 172 and the second insulating pattern 174 may include a plurality of patterns respectively corresponding to each pixel P. Namely, as shown in FIG. 10, which is a schematic plan view of an EL display device according to a second embodiment of the present disclosure, a plurality of first insulating patterns 172 and a plurality of second insulating patterns 174 are arranged along the first direction X. The first insulating patterns 172 cover a corner of each of the first and second pixels P1 and P2, which are arranged along the first direction, and correspond to the first and second pixels P1 and P2. The first insulating patterns 172 are spaced apart from each other. The second insulating patterns 174 are spaced apart from the first insulating pattern 172 along the second direction Y. The second insulating patterns 174 are spaced apart from each other in the first direction X. As shown in FIG. 8, the bank 180 overlaps the first insulating pattern 172 at the first side of the pixel without overlapping the first electrode 160 and overlaps the second insulating pattern 174 at the second side of the pixel without overlapping the first electrode 160. As shown in FIG. 9, the bank 180 covers a second end of the first electrode 160 (i.e., the bank 180 is in contact with a second end of the first electrode 160).

In addition, the bank 180 is formed at third and fourth sides of the pixels P1 and P2 as well as the first and second sides of the pixels P1 and P2. The bank 180 serves as a dam for preventing the emitting material solutions in adjacent pixels P form mixing.

In the EL display device 100, since a single-layered bank 180 is formed in the third and fourth sides of the pixel P, the decrease of the aperture ratio by the dual bank structure is prevented.

When the insulating pattern is formed in the third and fourth sides, the aperture ratio of the pixel P is decreased by the insulation pattern in the third and fourth sides. However, in the EL display device 100 of the present disclosure, since there is only the bank 180 without the insulating pattern 170 in the third and fourth sides of the pixel P, the aperture ratio is improved.

FIG. 8 is a cross-sectional view taken along the line VIII-VIII of FIG. 7, and FIG. 9 is a cross-sectional view taken along the line IX-IX of FIG. 7.

As shown in FIGS. 8 and 9, the EL display device 100 includes a substrate 110, where the plurality of pixels P (of FIG. 7) are defined, the driving TFT Td, the emitting diode D, the insulating pattern 170 and the bank 180. The driving TFT Td is formed on the substrate 110 and corresponds to each pixel P. The emitting diode D is connected to the driving TFT Td and corresponds to each pixel P. The insulating pattern 170 is positioned at the first and second sides of each pixel P, and the bank 180 surrounds each pixel P.

On the substrate 110, the gate line GL (of FIG. 5), the data line DL (of FIG. 5), the switching TFT Ts (of FIG. 5) and the power line PL (of FIG. 5) may be further formed. The gate line GL may extend along the first direction X (of FIG. 7), and the data line DL may extend along the second direction Y (of FIG. 7). The switching TFT Ts may be connected to the gate line GL and the data line DL. The power line PL may be parallel to and spaced apart from one of the gate line GL and the data line DL.

The gate and data lines GL and DL cross each other to define the pixel P, the driving TFT Td is connected to the switching TFT Ts. In addition, the storage capacitor Cst (of FIG. 5) may be further formed in the pixel P.

The substrate 110 may be a glass substrate or a flexible plastic substrate. For example, the substrate 110 may be a polyimide substrate.

A semiconductor layer 120 is formed on the substrate 110. The semiconductor layer 120 may include an oxide semiconductor material or polycrystalline silicon.

When the semiconductor layer 120 includes the oxide semiconductor material, a light-shielding pattern (not shown) may be formed under the semiconductor layer 120. The light to the semiconductor layer 120 is shielded or blocked by the light-shielding pattern such that thermal degradation of the semiconductor layer 120 can be prevented. On the other hand, when the semiconductor layer 120 includes polycrystalline silicon, impurities may be doped into both sides of the semiconductor layer 120.

A gate insulating layer 126 is formed on the semiconductor layer 120. The gate insulating layer 126 may be formed of an inorganic insulating material such as silicon oxide or silicon nitride.

A gate electrode 130, which is formed of a conductive material, e.g., metal, is formed on the gate insulating layer 126 to correspond to a center of the semiconductor layer 120. In addition, the gate line GL and a first capacitor electrode (not shown) of the storage capacitor Cst may be formed on the gate insulating layer 126. The gate line GL extends along the first direction, and the first capacitor electrode may be connected to the gate electrode 130.

In FIG. 8, the gate insulating layer 126 is formed on an entire surface of the first substrate 110. Alternatively, the gate insulating layer 126 may be patterned to have the same shape as the gate electrode 130.

An interlayer insulating layer 136, which is formed of an insulating material, is formed on the gate electrode 130. The interlayer insulating layer 136 may be formed of an inorganic insulating material, e.g., silicon oxide or silicon nitride, or an organic insulating material, e.g., benzocyclobutene or photo-acryl.

The interlayer insulating layer 136 includes first and second contact holes 137 and 138 exposing both sides of the semiconductor layer 120. The first and second contact holes 137 and 138 are positioned at both sides of the gate electrode 130 to be spaced apart from the gate electrode 130.

In FIG. 8, the first and second contact holes 137 and 138 are formed through the gate insulating layer 126. Alternatively, when the gate insulating layer 126 is patterned to have the same shape as the gate electrode 130, the first and second contact holes 137 and 138 is formed only through the interlayer insulating layer 136.

A source electrode 140 and a drain electrode 142, which are formed of a conductive material, e.g., metal, are formed on the interlayer insulating layer 136. In addition, the data line DL along the second direction, the power line PL and a second capacitor electrode (not shown) of the storage capacitor Cst may be formed on the interlayer insulating layer 136.

The source electrode 140 and the drain electrode 142 are spaced apart from each other with respect to the gate electrode 130 and respectively contact both sides of the semiconductor layer 120 through the first and second contact holes 137 and 138. The data line DL crosses the gate line GL to define the pixel region P, the power line PL, which supplying a high potential voltage, is spaced apart from the data line DL. Alternatively, the power line PL may be disposed at the same layer as the gate line and may be spaced apart from the gate line GL to be parallel to the gate line GL. The second capacitor electrode may be connected to the source electrode 140 and overlap the first capacitor electrode. As a result, the first and second capacitor electrodes and the interlayer insulating layer 136 as a dielectric layer therebetween constitute the storage capacitor Cst.

The semiconductor layer 120, the gate electrode 130, the source electrode 140 and the drain electrode 142 constitute the driving TFT Td. In the driving TFT Td, the gate electrode 130, the source electrode 140, and the drain electrode 142 are positioned over the semiconductor layer 120. Namely, the TFT Tr has a coplanar structure.

Alternatively, in the TFT Tr, the gate electrode may be positioned under the semiconductor layer, and the source and drain electrodes may be positioned over the semiconductor layer such that the driving TFT Td may have an inverted staggered structure. In this instance, the semiconductor layer may include amorphous silicon.

As mentioned above, the switching TFT Ts may be further formed in the first substrate 110. The switching TFT Ts may have a structure being substantially same as the driving TFT Td.

The gate electrode 130 of the driving TFT Td may be connected to a drain electrode of the switching TFT Ts, and the source electrode 140 of the driving TFT Td may be connected to the power line PL. A gate electrode and a source electrode of the switching TFT Ts may be connected to the gate line GL and the data line DL, respectively.

A passivation layer 150, which includes a drain contact hole 152 exposing the drain electrode 142 of the driving TFT Td, is formed to cover the driving TFT Td.

A first electrode 150, which is connected to the drain electrode 142 of the driving TFT Td through the drain contact hole 146, is separately formed in each pixel region P. The first electrode 150 may be formed of a conductive material having a relatively high work function to serve as an anode. For example, the first electrode 150 may be formed of a transparent conductive material such as indium-tin-oxide (ITO) or indium-zinc-oxide (IZO).

When the EL display device 100 is operated in a top-emission type, a reflection electrode or a reflection layer may be formed under the first electrode 150. For example, the reflection electrode or the reflection layer may be formed of silver (Ag) or aluminum-palladium-copper (APC) alloy. The first electrode 150 may have a triple-layered structure of ITO/Ag/ITO.

The insulating pattern 170 along the first direction X (of FIG. 7) is formed on the passivation layer 150. The insulating pattern 170 corresponds to the corner of the pixel P and covers an end of the first electrode 160. Namely, the insulating layer 170 corresponds to the first and second sides of the pixel P and covers a first side end and a second side end of the first electrode 160.

The insulating pattern 170 is formed of an organic insulating material or an inorganic insulating material and has a hydrophilic property. For example, the insulating pattern 170 may be formed of an inorganic insulating material, e.g., silicon oxide ($SiO_2$) or silicon nitride (SiNx), or an organic insulating material, e.g., photo-acryl or polyimide.

A bank 180 surrounding the pixel P is formed on the passivation layer 150 and the insulating pattern 170. Namely, the bank 180 at the first and second sides of the pixel P is disposed on the insulating pattern 170, and the bank 180 at the third and fourth sides of the pixel P is disposed on the passivation layer 150. Accordingly, the bank 180 has a first height H1 from the substrate 110 at the first and second sides of the pixel P and a second height H2, which is smaller than the first height, from the substrate 110 at the third and fourth sides of the pixel P. The bank 180 has a thickness being greater than the insulating pattern 170.

At the third and fourth sides of the pixel P, the bank 180 covers the end of the first electrode 160. Namely, the bank 180 at the first and second sides of the pixel P contacts the insulating pattern 170, and the bank 180 at the third and fourth sides of the pixel P contacts the first electrode 160.

On the other hand, the bank 180 at the first and second sides of the pixel P may be spaced apart from the first electrode 160 in a plane.

The bank 180 is formed of an organic insulating material or an inorganic insulating material and has a hydrophobic property. For example, the bank 180 may be formed of an inorganic insulating material, e.g., aluminum oxide ($Al_2O_3$) or chromium oxide (CrOx), or an organic insulating material, e.g., photo-acryl including fluorine (F) or silicon (Si) or polyimide including F or Si.

In a region surrounded by the bank 180, an emitting layer 162 is formed on the first electrode 160. The emitting layer 162 is formed by the solution process using a liquid phase emitting material.

Namely, an emitting material ink, in which an emitting material is dissolved in a solvent, is coated and dried to form the emitting layer 162. For example, the solution process may be an inkjet coating process, a slit coating process, a spin coating process, a printing process or a drop coating process, but it is not limited thereto.

The emitting material 162 includes at least one of an organic emitting material, such as a phosphorescent compound (phosphorescent emitting material) or a fluorescent compound (fluorescent emitting material), and an inorganic emitting material, such as a quantum dot.

The emitting layer 162 may have a single-layered structure of an emitting material layer (EML) including the emitting material. To improve an emitting efficiency of the emitting diode D, the emitting layer 162 may have a multi-layered structure of an hole injection layer (HIL), a hole transporting layer (HTL), the EML, an electron transporting layer (EIL) and an electron injection layer (EIL). The HIL and the HTL may be sequentially stacked between the first electrode 160 and the EML, and the ETL and the EIL may be sequentially stacked on the EML.

In the solution process, the emitting material solution (emitting material ink) is dropped at a center of the pixel P and spread into an entire surface of the pixel P. However, the emitting material solution may not be coated in the corner of the pixel P.

However, in the EL display device of the present disclosure, since the insulating pattern 170 is formed at the corner of the pixel P, the non-coating area corresponds to the insulating pattern 170. Accordingly, the degradation of the emitting property and the shortage between the first electrode 160 and a second electrode 164 by the non-coating area of the emitting material solution are prevented.

Figure 11:
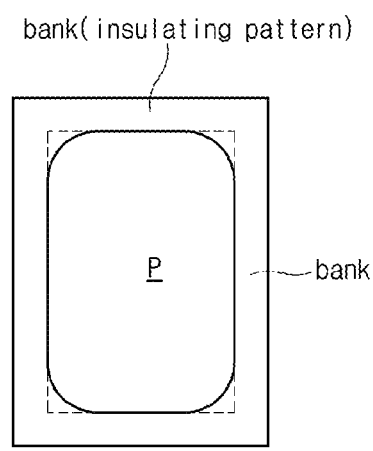
FIG. 11 is a schematic view illustrating the aperture ratio of an EL display device including a round-corner pixel and an EL display device of the present disclosure.

In addition, referring to FIG. 11, which is a schematic view illustrating the aperture ratio of an EL display device including a round-corner pixel and an EL display device of the present disclosure, by forming the insulating pattern to cover the corner of the pixel instead of providing a round shape in the corner of the pixel, the aperture ration of the pixel is increased.

Referring to FIGS. 8 and 9 again, the second electrode 164 is formed on the emitting layer 162. The second electrode 164 covers an entire surface of the display region. The second electrode 164 may be formed of a conductive material having a relatively low work function to serve as a cathode. For example, the second electrode 164 may be formed of aluminum (Al), magnesium (Mg), Al—Mg alloy, Al-silver alloy.

In the top-emission type EL display device 100, the second electrode 164 may have a relatively small thickness to transmit light. On the other hand, in the bottom-emission type EL display device 100, the second electrode 164 may be a reflective electrode.

The first electrode 160, the second electrode 164 facing the first electrode 160 and the emitting layer 162 therebetween constitute the emitting diode D.

As mentioned above, in the EL display device 100, the insulating pattern 170 is formed at the first and second sides of the pixel P except the third and fourth sides of the pixel P to cover the corner of the pixel P such that the aperture ratio is increased without the degradation of the display quality resulting from the non-coating area of the emitting layer.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An electroluminescent display device, comprising:
a substrate;
a pixel having a lateral side and a longitudinal side that intersects the lateral side from a plan view of the electroluminescent display device, the pixel including an emitting diode disposed over the substrate, the emitting diode including a first electrode, an emitting layer on the first electrode, and a second electrode on the emitting layer;
an insulating pattern overlapping the lateral side of the pixel and covering a first end of the first electrode at the lateral side of the pixel; and
a bank surrounding the pixel,
wherein the bank overlaps the insulating pattern at the lateral side of the pixel, and the bank at the longitudinal side of the pixel covers a second end of the first electrode without the insulating pattern being disposed between the second end of the first electrode and the bank.

2. The electroluminescent display device according to claim 1, further comprising:
a driving part between the substrate and the emitting diode,
wherein the insulating pattern overlaps the driving part.

3. The electroluminescent display device according to claim 1, the first electrode is horizontally spaced apart from the bank at the lateral side of the pixel such that the first electrode is not contacting the bank at the lateral side.

4. The electroluminescent display device according to claim 1, wherein the bank is in contact with the insulating pattern at the lateral side of the pixel but is not in contact with the first end of the first electrode, and wherein the bank is in direct contact with the second end of the first electrode at the longitudinal side of the pixel.

5. The electroluminescent display device according to claim 1, wherein at a corner of the pixel formed at an intersection of the lateral side of the pixel and the longitudinal side of the pixel, the insulating pattern covers the first electrode.

6. The electroluminescent display device according to claim 1, further comprising:
   a thin film transistor on the substrate; and
   a passivation layer between the thin film transistor and the emitting diode,
   wherein the insulating pattern in in contact with the passivation layer at the lateral side of the pixel, and
   wherein the bank is in contact with the passivation layer at the longitudinal side of the pixel.

7. The electroluminescent display device according to claim 1, further comprising:
   another insulating pattern that overlaps another lateral side of the pixel that is parallel to the lateral side of the pixel.

8. The electroluminescent display device according to claim 1, wherein the insulating pattern has a hydrophilic property, and the bank has a hydrophobic property.

9. The electroluminescent display device according to claim 1, wherein the emitting layer is formed by a solution process.

10. The electroluminescent display device according to claim 1, wherein the bank is thicker than the insulating pattern.

11. The electroluminescent display device according to claim 1, wherein a distance from an upper surface of the substrate to an upper surface of the bank at the lateral side of the pixel is greater than a distance from the upper surface of the substrate to the upper surface of the bank at the longitudinal side of the pixel.

12. An electroluminescent display device, comprising:
   a pixel including a plurality of first edges in a first direction and a plurality of second edges in a second direction that is different from the first direction, the pixel having a first electrode, a light emitting layer on the first electrode, and a second electrode on the light emitting layer;
   a first insulating layer overlapping one edge of the plurality of first edges of the pixel, the first insulating pattern covering a first end of the first electrode at the one edge of the plurality of first edges of the pixel;
   a second insulating layer overlapping another edge of the plurality of first edges of the pixel, the second insulating pattern covering a second end of the first electrode that is opposite the first end of the first electrode at the another edge of the plurality of first edges of the pixel; and
   a bank surrounding the pixel, the bank configured to overlap the first insulation layer without overlapping the first end of the first electrode at the one edge of the plurality of first edges of the pixel, and overlap the second insulation layer without overlapping the second end of the first electrode at the another edge of the plurality of first edges of the pixel,
   wherein the bank covers a third end of the first electrode at one edge of the plurality of second edges of the pixel, and covers a fourth end of the first electrode at another edge of the plurality of second edges of the pixel.

13. The electroluminescent display device of claim 12, wherein the bank is in contact with the third end of the first electrode at the one edge of the plurality of second edges of the pixel, and the bank is in contact with the fourth end of the first electrode at the another edge of the plurality of second edges of the pixel.

14. The electroluminescent display device of claim 12, wherein the second insulating layer is wider than the first insulation layer in a plan view of the electroluminescent display device.

15. The electroluminescent display device according to claim 12, wherein at corners of the pixel formed by intersections between the plurality of first edges and the plurality of second edges, the first insulating layer and the second insulating layer cover the first electrode.

16. The electroluminescent display device according to claim 12, wherein the first insulating layer and the second insulating layer has a hydrophilic property, and the bank has a hydrophobic property.

17. The electroluminescent display device according to claim 12, wherein the bank is thicker than the first insulating layer and the second insulating layer.

18. The electroluminescent display device according to claim 12, wherein a distance from an upper surface of a substrate of the electroluminescent display device to an upper surface of the bank at the plurality of first edges of the pixel is greater than a distance from the upper surface of the substrate to the upper surface of the bank at the plurality of second edges of the pixel.

19. The electroluminescent display device according to claim 12, further comprising:
   a thin film transistor; and
   a passivation layer between the thin film transistor and the first electrode,
   wherein the first insulating layer and the second insulating layer are in contact with the passivation layer at the plurality of first edges of the pixel, and
   wherein the bank is in contact with the passivation layer at the plurality of second edges of the pixel.

* * * * *